US010063968B1

(12) United States Patent
Family et al.

(10) Patent No.: US 10,063,968 B1
(45) Date of Patent: Aug. 28, 2018

(54) DYNAMIC MASTER ASSIGNMENT IN DISTRIBUTED WIRELESS AUDIO SYSTEM FOR THERMAL AND POWER MITIGATION

(71) Applicant: Apple Inc., Cupertino, CA (US)

(72) Inventors: Afrooz Family, Emerald Hills, CA (US); Daniel R. Borges, Redwood City, CA (US); Daniel S. Naito, Campbell, CA (US); James M. Hollabaugh, San Jose, CA (US); Jay S. Nigen, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/612,904

(22) Filed: Jun. 2, 2017

(51) Int. Cl.

| | |
|---|---|
| ***H03G 11/00*** | (2006.01) |
| ***H04R 3/00*** | (2006.01) |
| ***H04R 3/12*** | (2006.01) |
| ***H04R 29/00*** | (2006.01) |
| ***H04R 27/00*** | (2006.01) |

(52) U.S. Cl.
CPC ............... *H04R 3/007* (2013.01); *H04R 3/12* (2013.01); *H04R 27/00* (2013.01); *H04R 29/002* (2013.01); *H04R 2227/003* (2013.01); *H04R 2227/005* (2013.01); *H04R 2420/07* (2013.01)

(58) Field of Classification Search
CPC .......... H04R 3/007; H04R 3/12; H04R 27/00; H04R 29/002; H04R 2227/003; H04R 2227/005; H04R 2420/07
USPC .................................. 381/55, 59, 77, 96, 98
See application file for complete search history.

(56) References Cited

U.S. PATENT DOCUMENTS

| | | | | |
|---|---|---|---|---|
| 4,503,554 | A | 3/1985 | Davis | |
| 7,155,017 | B2 * | 12/2006 | Kim | H04R 29/007 381/59 |
| 9,697,844 | B2 * | 7/2017 | Walsh | G10L 19/16 |
| 9,864,569 | B2 * | 1/2018 | Pelland | G06F 3/162 |
| 9,917,554 | B2 * | 3/2018 | Gautama | H03F 1/52 |
| 2016/0034416 | A1 | 2/2016 | Chavez et al. | |

FOREIGN PATENT DOCUMENTS

| | | |
|---|---|---|
| AU | 2011211407 | 9/2011 |

* cited by examiner

*Primary Examiner* — Vivian Chin
*Assistant Examiner* — Friedrich W Fahnert
(74) *Attorney, Agent, or Firm* — Womble Bond Dickinson (US) LLP

(57) ABSTRACT

A method for operating a distributed wireless audio system including several loudspeaker cabinets all of which can communicate with each other as part of a computer network. The method receives temperature data that is indicative of temperature of a first loudspeaker cabinet, which has a network master responsibility of obtaining an audio signal from an audio source and wirelessly transmitting some of the audio signal to a second loudspeaker cabinet of several loudspeaker cabinets, for playback by the second loudspeaker cabinet, while playing back some of the audio signal by the first loudspeaker cabinet. The method determines whether a thermal threshold of the first loudspeaker cabinet has been reached, based on the temperature data. The method, in response to the thermal threshold being reached, gives up the network master responsibility from the first loudspeaker cabinet to the second loudspeaker cabinet, where doing so reduces temperature in the first loudspeaker cabinet.

21 Claims, 8 Drawing Sheets

DYNAMIC MASTER ASSIGNMENT IN DISTRIBUTED WIRELESS AUDIO SYSTEM FOR THERMAL AND POWER MITIGATION

FIELD

An embodiment of the invention relates to a wireless audio system that dynamically assigns a master responsibility amongst a network of loudspeaker cabinets in the wireless audio system, for thermal and power mitigation.

BACKGROUND

A wireless audio system is a system in which several wireless speakers receive audio signals (for rendering and playback) using radio frequency ("RF") waves that are transmitted over the air by an RF transmitter unit, rather than over audio cables. Such systems are becoming more prevalent inside and outside users' homes, as these systems give users the flexibility to project sound from nearly any location, within transmission range of the RF transmitter unit. Furthermore, such a system is advantageous for conventional wired home theater systems, as users can position the wireless speakers without concerns about tripping over or hiding the audio cables that lead back to the home theater system's receiver.

SUMMARY

An embodiment of the invention is a method for operating a wireless audio system that is distributed in that it includes several loudspeaker cabinets, all of which can communicate with each other wirelessly as part of a computer network, by dynamically re-assigning a network master responsibility from a first (e.g., "master") loudspeaker cabinet to a second (e.g., "slave") loudspeaker cabinet, when the first loudspeaker cabinet reaches a thermal threshold. The first loudspeaker cabinet has the network master responsibility of (1) obtaining an audio signal from an audio source and (2) wirelessly transmitting some of the audio signal to at least one other loudspeaker cabinet (here, the second loudspeaker cabinet) for playback by the second loudspeaker cabinet, while the first loudspeaker cabinet also plays back some of the audio signal. The method includes receiving temperature data (e.g., an internal temperature measurement) from the first loudspeaker cabinet. The method determines whether the thermal threshold of the first loudspeaker cabinet has been reached, based on the temperature data. In response to the thermal threshold being reached, the method gives up the network master responsibility from the first loudspeaker cabinet to the second loudspeaker cabinet, where doing so is expected to result in a reduction in temperature in the first loudspeaker cabinet.

In one embodiment, a master rank variable is used to determine whether the second loudspeaker cabinet can be given the network master responsibilities. For instance, assume that the first loudspeaker cabinet has a "high enough" master rank that is associated with performing the network master responsibility. Based on the temperature data being used to determine whether the thermal threshold has been reached, the master rank variable is set to a new master rank, e.g., lowers its master rank in response to its temperature rising above the threshold. If the second loudspeaker cabinet now has a higher master rank than the new master rank of the first loudspeaker cabinet (based on a comparison of the new master rank and the master rank of the second loudspeaker cabinet), then the first loudspeaker cabinet gives up the network master responsibilities to the second loudspeaker cabinet. As the first loudspeaker cabinet no longer has the network master responsibilities, it ceases to obtain and wirelessly transmit the audio signal to the second loudspeaker cabinet. Instead, the second loudspeaker cabinet, acting now as master, performs the duties (e.g., obtaining the audio signal from the audio source and wirelessly transmitting the audio signal to other cabinets, including the first loudspeaker cabinet) that were previously assigned to the first loudspeaker cabinet, such that the first loudspeaker cabinet now receives, from the second loudspeaker cabinet, some of the audio signal for playback at the first loudspeaker cabinet. In order to know when the second loudspeaker cabinet has a higher master rank than the first loudspeaker cabinet, messages (e.g., data packets) are repeatedly transmitted between the cabinets (e.g., the first and second loudspeaker cabinets exchange messages). These messages may include not only a current master rank of the cabinet transmitting the message, but also additional information (e.g., temperature data). By knowing the second loudspeaker cabinet's master rank, through the use of these messages, the cabinets know implicitly who should be master, without requiring any explicit communication in order to make such a determination (e.g., each cabinet having to request another cabinet's master rank).

In another embodiment, in conjunction with, or instead of, giving up the network master responsibility in response to the thermal threshold being reached, the first loudspeaker cabinet gives up the network master responsibility in response to and when an energy or power consumption threshold (e.g., power budget) has been met by the first loudspeaker cabinet. The first loudspeaker cabinet receives power consumption data (e.g., measured or sensed current power consumption) of the first loudspeaker cabinet. Once energy or power consumption of the first loudspeaker cabinet rises to the threshold (e.g., because of continuously (1) obtaining and wirelessly transmitting audio content and (2) playing back of the audio signal), the network master responsibility can be given up to reduce its energy or power consumption. For example, similar to the thermal threshold, when the energy or power consumption threshold has been met, due to increasing power consumption by the first loudspeaker cabinet, the network master responsibility may be given up due to a reduction of the master rank. Otherwise, the first loudspeaker cabinet will need to decrease its energy or power consumption through other means (e.g., by reducing audio quality, which may cause an undesirable listening experience for a user) to maintain its power consumption below the threshold. In one embodiment, the energy or power consumption threshold is variable and varies based on the temperature data from the first loudspeaker cabinet, such that when temperature data is indicative of a high (e.g., internal) temperature reading of the first loudspeaker cabinet, the energy or power consumption threshold will be reduced. With a reduction of the energy or power consumption threshold, the first loudspeaker cabinet may relinquish the network master responsibility sooner, in order to ensure that the cabinet's energy or power consumption remains below the threshold and that the user's listening experience of audio output by the first loudspeaker cabinet is less likely to be adversely impacted.

In one embodiment, rather than relinquishing the master responsibility entirely, the master loudspeaker cabinet may share the master responsibility with at least one slave loudspeaker cabinet. By sharing the master responsibility, the slave loudspeaker cabinet is tasked to distribute at least some of the audio signal to other slave loudspeaker cabinets, thereby changing the topology of the computer network by routing the audio signal through the slave loudspeaker cabinet. The decision to whom the master responsibility is shared may be based on at least one of temperature, power consumption, and master rank. In another embodiment, the master responsibility is shared with a slave loudspeaker cabinet based on the cabinet's location and/or current tasks being performed at the cabinet (e.g., whether audio is being played through a transducer of the slave loudspeaker cabinet).

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
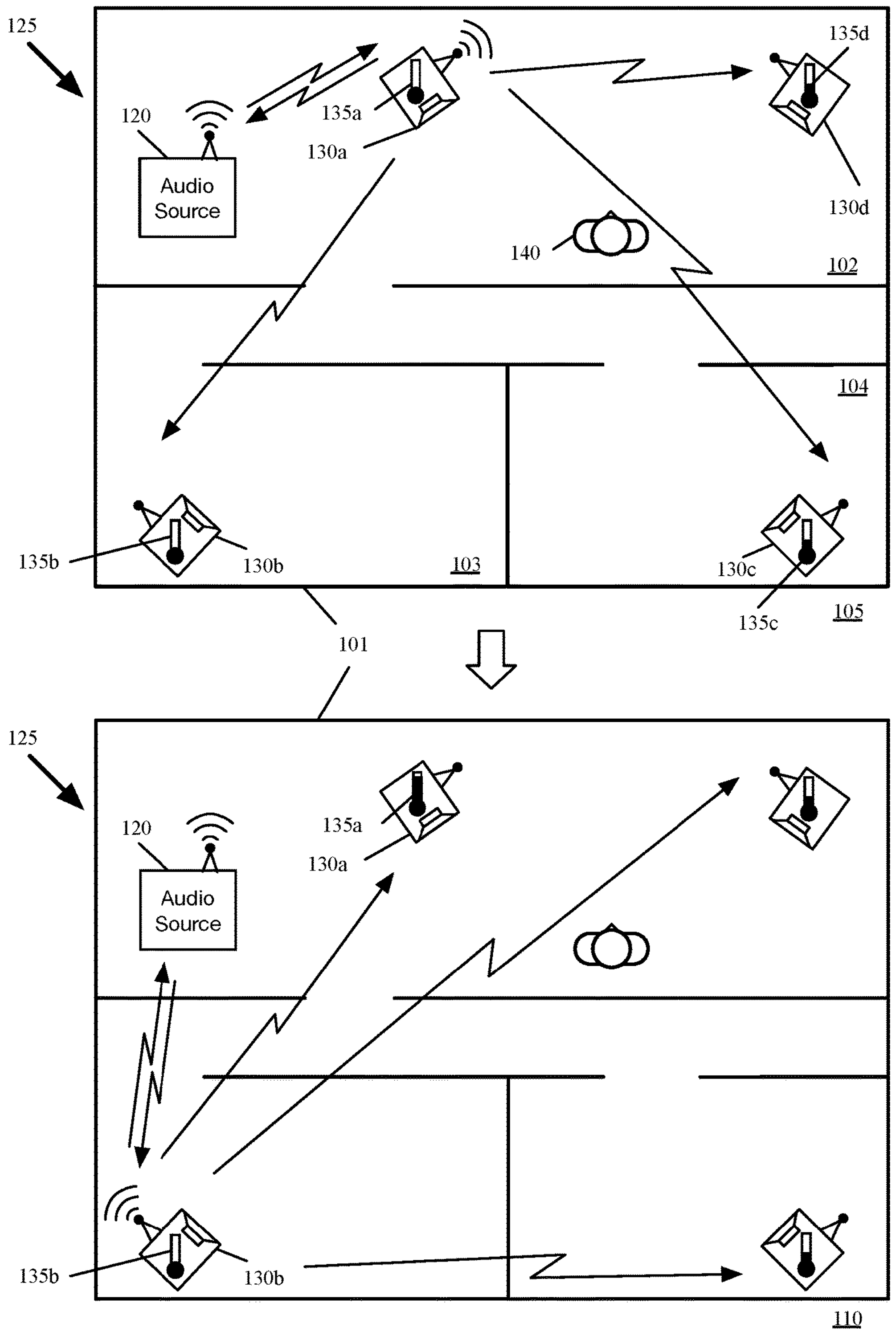
FIG. 1 shows downward views of a home layout in which a distributed wireless audio system is operating.

FIG. 1 shows downward views of a home layout 101 in which a distributed wireless audio system 125 is operating. Specifically, this figure illustrates a network master responsibility performed by a loudspeaker cabinet 130*a* in stage 105 being moved (e.g., dynamically reassigned) to a different loudspeaker cabinet 130*b* in stage 110 due to an increase in internal temperature.

The distributed wireless audio system 125 includes a wireless audio source 120 and several wireless loudspeaker cabinets 130*a*-130*d*. The wireless loudspeaker cabinets 130*a*-130*d* are in a peer-to-peer ("P2P") distributed wireless computer network, using e.g., BLUETOOTH protocol or a wireless local area network. For instance, each of the wireless loudspeaker cabinets 130*a*-130*d* communicate (e.g., using IEEE 802.11x standards) with each of the other wireless loudspeaker cabinets by transmitting and receiving data packets (e.g., Internet Protocol (IP) packets). In order for the wireless loudspeaker cabinets to communicate efficiently, they communicate with each other over the P2P distributed wireless computer network in a "master-slave" configuration. In particular, loudspeaker cabinet 130*a* is designated as the "master" and loudspeaker cabinets 130*b*-130*d* are designated as the "slaves". As will be described later, the role of master is accompanied with specific operations that are performed by the master cabinet (e.g., distributing an audio signal to slave cabinets). Each cabinet, however, regardless of designation, performs some similar operations. For instance, each cabinet will render and playback audio signals; rendering may include digital processing of some or all of the input audio signal, to for example perform spectral shaping or dynamic range control upon some of the audio signal, create a downmix from multiple channels in the audio signal, performing beamformer processing to produce speaker driver signals for a loudspeaker transducer array (in the loudspeaker cabinet), or other digital processing to produce speaker driver signals that may better "match" the acoustic environment of the loudspeaker cabinet or its transducer capabilities; while playback refers to conversion of the resulting digital speaker drivers signals into sound by acoustic transducers that may also be integrated within the cabinet.

Acting as the master, however, loudspeaker cabinet 130*a* performs additional operations. Cabinet 130*a* wirelessly communicates with the wireless audio source 120, over the wireless computer network, in order to (1) retrieve an audio signal, (which may include multiple audio channels or audio objects of a piece of sound program content) and (2) distribute at least some of the audio signal to the other loudspeaker cabinets for playback. The audio source 120 may provide a digital audio signal or an analog audio signal to the loudspeaker cabinet 130*a*. Once received, the loudspeaker cabinet 130*a* may perform various operations in order to decode the signal. This is further described in FIG. 2.

The wireless audio source 120 may be any device that is capable of streaming an audio signal to the loudspeaker cabinet 130*a*, while the audio signal is being played back by at least the loudspeaker cabinet 130*a*. For example, the wireless audio source 120 may be a desktop computer, a laptop, or a mobile device (e.g., a smartphone). To stream the audio signal, the wireless audio source 120 may retrieve the audio signal locally (e.g., from an internal or external hard drive; or from an audio playback device, such as a cassette tape player) or remotely (e.g., over the Internet). If the audio signal is retrieved remotely, the wireless audio source 120 may retrieve the audio signal through an access point (e.g., wireless router) or over the air (e.g., a cellular network). In one embodiment, rather than being wireless, the audio source may be connected to at least the loudspeaker cabinet 130*a* through a wired connection (e.g., a Universal Serial Bus connection).

In one embodiment, the master loudspeaker cabinet streams an audio signal from the audio source, upon receiving a request from a listener 140 to playback the audio content (e.g., a musical work or movie soundtrack). Once the audio signal is retrieved, the master loudspeaker cabinet 130*a* distributes at least some of the audio signal to the other loudspeaker cabinets 130*b*-130*d* in order for each of the loudspeaker cabinets (including the master) to render and playback the audio signal. In addition, to distributing the audio signal, the master may also designate loudspeaker cabinets to playback certain audio channels contained within the audio signal (e.g., loudspeaker 130*d* may be directed to play a right audio channel of a piece of audio content, while loudspeaker cabinet 130*a* plays a left audio channel of the same piece of audio content) or perform certain signal processing operations (e.g., adjusting spectral shape of an audio channel within the audio signal). Along with performing tasks similar to the slave loudspeaker cabinets (e.g., rendering and playing back the audio signal), the additional tasks performed by the master loudspeaker cabinet previously described, may result in an increase in its internal temperature. In order to ensure that the loudspeaker cabinet does not overheat, in one embodiment of the invention, the distributed wireless audio system 125 delegates the network master responsibility between other loudspeaker cabinets within the system. Otherwise, if the master loudspeaker cabinet did not relinquish its network master responsibility, the increased temperature may have adverse effects on the overall performance of the cabinet (e.g., a reduction of audio quality, automatic shutoff, or damage to internal components). In one embodiment, the increase in internal temperature is a result of normal audio playback operations performed by the cabinet.

Stage 105 illustrates the distributed wireless audio system 125 operating with loudspeaker cabinet 130*a* as master and the other loudspeaker cabinets 130*b*-130*d* as slaves (as previously described). Loudspeaker cabinet 130*a* may be streaming an audio signal from the audio source 120 to loudspeakers 130*b*-130*d* for playback. Acting as master, loudspeaker 130*a* communicates with the audio source 120 to (1) retrieve the audio signal (e.g., either locally or remotely stored, as previously described) and (2) distribute the audio signal to the other loudspeaker cabinets. In this example, the listener 140 is listening to an audio signal being streamed and played through loudspeakers 130*a* and 130*d* in room 102. As previously described, the audio signal may include at least two audio channels, a left channel and a right channel. In this case, as loudspeaker cabinet 130*a* distributes at least some of the audio signal (e.g., the right channel) to loudspeaker 130*d*, both loudspeaker cabinets playback their respective audio channels. The other loudspeaker cabinets 130*b*-130*c* may be playing back the same audio signal in rooms 103-104, respectively. For example, since room 103 includes a single loudspeaker cabinet 130*b*, the audio signal (which may include the right channel and left channel) may be downmixed, in order to playback a mono version of the audio signal. In other embodiments, the other loudspeaker cabinets 130*b*-130*c* may be playing different pieces of audio content contained within the audio signal with respect to 130*a* (and with respect to each other) or may not be playing anything at all.

As illustrated in stage 105, each loudspeaker cabinet 130*a*-130*d* includes internal thermometer 135*a*-135*d*, respectively, represented as a traditional hermetically sealed glass tube with mercury. Internal temperatures 135*a*-135*b* of loudspeaker cabinets 130*a*-130*b* are low or below a thermal threshold, which is illustrated by the mercury being contained within the bulb of the glass tube. The internal temperatures 135*c*-135*d* of loudspeakers 130*c*-130*d* are slightly higher than internal temperatures 135*a*-135*b* (illustrated by the mercury being contained within the bottom of the glass tube). These internal thermometers may indicate the overall ambient internal temperature of the loudspeaker cabinets. In other embodiments, the thermometers indicate a particular component temperature (e.g., a central processing unit ("CPU")) of the loudspeaker cabinet.

Stage 110 illustrates loudspeaker 130*a* relinquishing the network master responsibility to loudspeaker cabinet 130*b*, thereby taking on a slave role. The transition between stages 105 and 110 is a result of the internal temperature of the loudspeaker cabinet 130*a* meeting or exceeding the thermal threshold, as illustrated by the mercury of the internal thermometer 135*a* reaching almost the top of the glass tube. The internal temperature measured by the internal thermometer 135*a* may have increased for various reasons. For example, the loudspeaker cabinet performing the additional tasks previously described (e.g., fetching and distributing the audio signal to other loudspeaker cabinets) is causing the increase in temperature. With conducting these tasks, at least one component of the loudspeaker cabinet 130*a* (e.g., the CPU) may have increased its performance, thereby increasing the internal temperature of the cabinet.

However, the internal temperature of the loudspeaker cabinet may rise for other reasons. For example, the increase in temperature may be due to performing normal audio playback operations after a period of time (e.g., heat caused by the cabinet's transducer while it produces sound). On the other hand, the loudspeaker cabinet (in response to a request from the listener 140) may drive its transducer to produce more low frequency sound (e.g., bass) or to increase the overall volume. In either case, a driver of the transducer will work harder to produce the sound, thereby increasing the temperature of the loudspeaker cabinet in which it resides. Another reason may be that the external temperature (e.g., the temperature of the room in which the loudspeaker cabinet resides) may increase. For instance, the loudspeaker cabinet may be under a window in which at certain times of the day the sun is directly shining on the loudspeaker cabinet. And yet another reason may be that cabinet has been placed next to a heating element (e.g., oven, stove, heat vent). Although the overall performance of the loudspeaker cabinet may be sustainable, its internal temperature may increase due to this external heat. Regardless of the reason, once the internal temperature reaches a thermal threshold, operations performed by the loudspeaker cabinet may be delegated, otherwise performance (e.g., audio quality) may need to be degraded in order to relieve operational stress on the cabinet.

If the cabinet 130*a* does not relinquish the network master responsibility, there may be adverse consequences. For instance, as the internal temperature increases, the cabinet 130*a* may reduce the audio quality in order to avoid any component damage that may be caused by excessive heat. To reduce audio quality, the cabinet 130*a* may reduce the amount of low frequency components within the audio or may lower the entire volume of the sound produced by the cabinet. Lowering the low frequency components or the volume will lessen the work being performed by a driver of the transducer of the cabinet 130*a*. By managing the driver, which exerts heat during audio playback, the cabinet 130*a* may reduce the internal temperature. However, reducing audio quality to decrease internal temperature is not preferable, as a listener's audio experience will suffer.

Turning back to stage 110, as the internal temperature of the internal thermometer 135*a* meets or exceeds the thermal threshold, the network master responsibility has been shifted from loudspeaker cabinet 130*a* to 130*b*, which itself has a lower internal temperature than the other two loudspeaker cabinets 130*c*-130*d*. By doing this, cabinet 130*a* ceases to obtain the audio signal from the audio source 120 and wirelessly transmit the audio signal to the other cabinets 130*b*-130*d*. The distributed wireless audio system 125 decides who should take over the network master responsibility based on a master rank of each of the loudspeaker cabinets. The master rank (or desire to be master) may be based on several criteria. For instance, the rank may be based on at least one of a current internal temperature of the cabinet, an available power budget of the cabinet, and tasks currently being performed by the cabinet. Once a master rank is computed, the cabinet with the highest master rank may ultimately take over the network master responsibility, in one embodiment. More about the process of how a new loudspeaker cabinet is chosen to take over the network master responsibility is described in FIG. 5. With loudspeaker cabinet 130*b* taking over the network master responsibility, this cabinet now communicates with the audio source 120 to fetch and distribute the audio signal to the other cabinets (130*a* and 130*c*-130*d*). Such a system allows for dynamic reassignment of the network master responsibility in order to manage thermal output of each individual loudspeaker cabinet.

Figure 2:
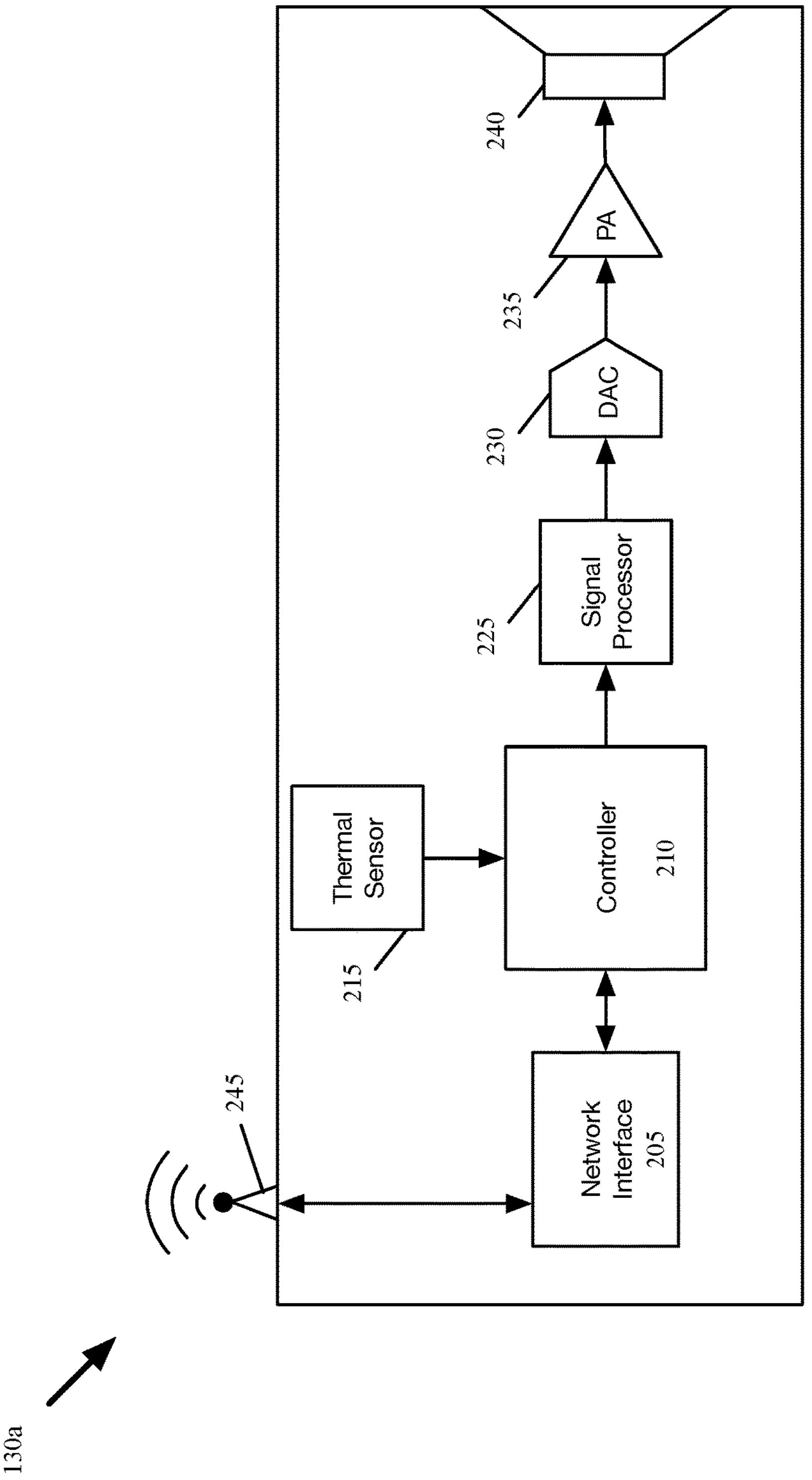
FIG. 2 shows a block diagram of a wireless loudspeaker cabinet according to one embodiment of the invention.

FIG. 2 shows a block diagram of the wireless loudspeaker cabinet 130*a* that is being used for streaming an audio signal of a piece of sound program content (e.g., a musical work, or a movie sound track). Although this block diagram represents cabinet 130*a*, it should be understood that this block diagram is representative of any of the other wireless loudspeaker cabinets 130*b*-130*d* illustrated in FIG. 1. The cabinet 130*a* includes a wireless antenna 245, a network interface 205, a controller 210, a thermal sensor 215, a storage 220, a signal processor 225, a digital-to-analog converter (DAC) 230, an amplifier (PA) 235, and a loudspeaker transducer 240. The loudspeaker cabinet 130*a* may be any computing device that is capable of wireless transmission and playback of piece of sound program content, as previously described in FIG. 1. For example, the loudspeaker cabinet 130*a* may be a multi-function electronic device that has an integrated speaker (e.g., a consumer electronics device), such as a laptop computer, a desktop computer, a tablet computer, a smartphone, or a speaker dock. Or, the cabinet may be a standalone loudspeaker. In one embodiment, the loudspeaker cabinet 130*a* may be a part of a home audio system. In another embodiment, rather than being a part of a home audio system, the cabinet 130 may be a part of an audio system in a vehicle. Each element of the loudspeaker cabinet 130*a* shown in FIG. 2 will now be described.

The controller 210 may be a special purpose processor such as an application specific integrated circuit (ASIC), a general purpose microprocessor, a field-programmable gate array (FPGA), a digital signal controller, or a set of hardware logic structures (e.g., filters, arithmetic logic units, and dedicated state machines). While the cabinet 130*a* acts as master, controller 210 is to perform several management functions (previously described) that include at least fetching and distributing an audio signal of a piece of sound program content to other cabinets. To do so, the controller 210 interacts with the network interface 205 to send and receive data over the P2P distributed wireless network, using antenna 245. For instance, if the controller 210 wants to fetch an audio signal of a particular piece of audio program content for streaming to other loudspeaker cabinets, the controller 210 sends a request to the audio source 120 (as shown in FIG. 1) through the network interface 205. Once the audio signal (or at least a portion of the audio signal) of the piece of audio program content is received, the controller 210 may then distribute the received audio signal (or some of the received audio signal) to the appropriate cabinets through the network interface 205.

The audio signal of the piece of sound program content received by the controller 210 may be digital data that requires signal processing. In particular, the digital data received by the controller 210 may be encoded using any suitable audio codec, e.g., Advanced Audio Coding (AAC), MPEG Audio Layer II, MPEG Audio Layer III, and Free Lossless Audio Codec (FLAC). In order to process the digital data, the controller 210 may include a decoder that is for producing a digital audio input to the signal processor 225. The audio signal in this case may be a single input audio channel. Alternatively, however, there may be more than one input audio channel, such as a two-channel input, namely left and right channels of a stereophonic recording of a music work, or there may be more than two input audio channels, such as for example the entire audio soundtrack in 5.1-surround format of a motion picture film or movie. In the case in which the audio signal may include multiple channels, the controller 210 may also include an encoder for re-encoding the processed digital audio for subsequent transmission to other loudspeaker cabinets to decode and playback other audio channels (or the same audio channel as this cabinet). In other embodiments, the audio signal of the piece of sound program content is distributed to other loudspeaker cabinets within the P2P distributed wireless network without any processing. In other words, as soon as the audio signal is received, it is immediately distributed to the other cabinets.

In one embodiment, the controller 210 is to receive digital information (e.g., temperature data) from the thermal sensor 215 that indicates a current internal temperature of the loudspeaker cabinet 130*a*. In one embodiment, the temperature data represents the temperature in any standard temperature unit (e.g., degrees of Fahrenheit or Celsius). As previously described, the thermal sensor 215, in some embodiments, may measure temperature of a component (e.g., the network interface 205, the controller 210, the signal processor 225, or PA 235) or a combination of components within the loudspeaker cabinet 130*a*. In one embodiment, the thermal sensor 215 measures a temperature of the speaker driver (e.g., voice coil) of the transducer 240. The thermal sensor 215, in other embodiments, measures the ambient internal temperature of the loudspeaker cabinet 130*a*, as opposed to the temperature of a particular component. A virtual temperature of a location in the cabinet at which there is no temperature sensor may also be computed. The controller 210 may use all of this digital temperature information for determining a master rank that is used to decide whether the cabinet should maintain the network master responsibility or relinquish it to another cabinet. More about the master rank and determining whether the network master responsibility should be maintained is further described in FIG. 5.

The signal processor 225 is to receive the digital audio signal from the controller 210 for audio signal processing. Like the controller 210, the signal processor 225 may be a separate special purpose processor. In one embodiment, rather than being separate, the signal processor 225 is a part of the same microelectronic processor as controller 210 (just running a different software program). Upon receiving digital audio, the signal processor 225 may adjust the digital audio based on several factors. For instance, the digital audio may be modified according to user preferences (e.g., a particular spectral shape of the audio or a particular volume of the audio) in order for this particular cabinet to output modified audio. In one embodiment, the signal processor 225 may adjust the digital audio in order to alleviate other cabinets from performing this task. For instance, the signal processor 225 may adjust the spectral shape of a portion of the digital audio (e.g., based on user preferences) where the network interface 205 is to then distribute this adjusted portion of the digital audio to the other cabinets. Performing audio signal processing on behalf of other cabinets reduces computational operations required to process the digital audio in the other cabinets, thereby allowing these other cabinets to use their available power consumption budget for other operations. Reducing the audio signal processing operations in the other cabinets helps lower their respective internal temperatures.

The DAC is to receive a digital audio signal that is produced by the signal processor 225 and is to convert it into an analog input. The PA 235 is to receive the analog input from the DAC 230 and is to provide a drive signal to the transducer 240. Although the DAC 230 and the PA 235 are shown as separate blocks, in one embodiment the electronic circuit components for these may be combined, not just for the loudspeaker driver but also for multiple loudspeaker drivers (such as part of a loudspeaker array), in order to provide for a more efficient digital to analog conversion and amplification operation of the individual driver signals, e.g., using for each class D amplifier technologies.

The transducer 240 is to receive the driver signals from the PA 235 and is to use the driver signals to produce sound. The transducer 240 may be an electrodynamic driver that may be specifically designed for sound output at a particular frequency bands, such as a subwoofer, tweeter, or midrange driver, for example. In one embodiment, as previously described, the loudspeaker cabinet 130*a* may have integrated therein several loudspeaker transducers, e.g., forming a loudspeaker array. Each of the loudspeaker transducers in the array may be arranged side by side in a single row in the style of a sound bar, for example.

Figure 3:
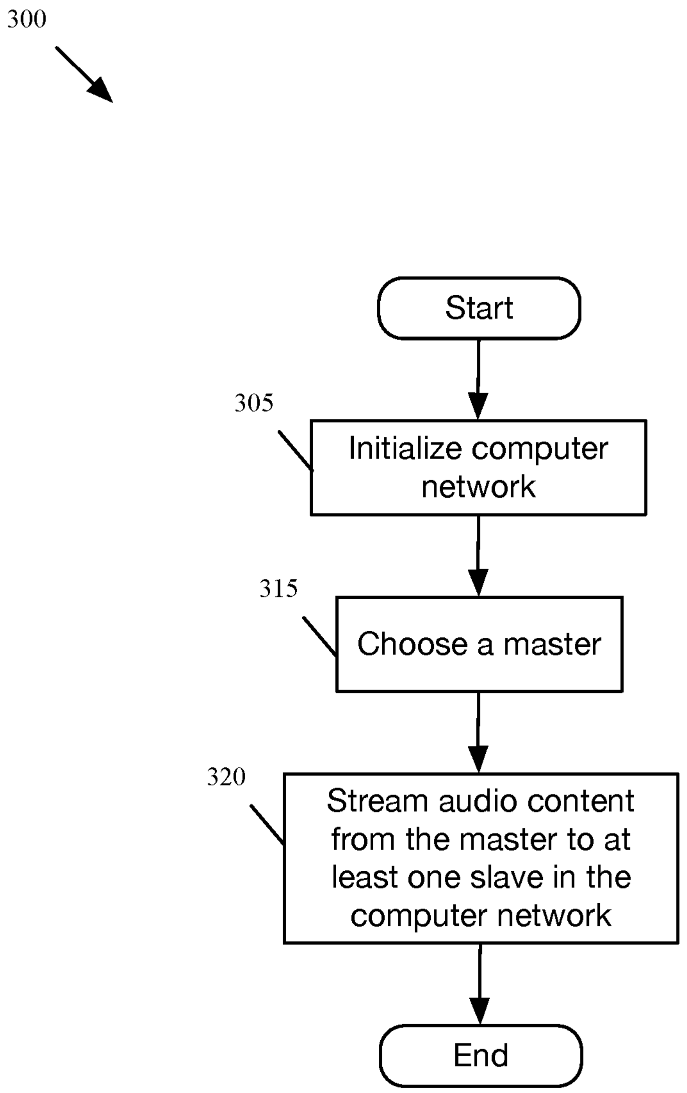
FIG. 3 is a flowchart of one embodiment of a process to establish a distributed wireless audio system.

FIG. 3 is a flowchart of one embodiment of a process 300 to establish a P2P distributed wireless network between several loudspeaker cabinets. In one embodiment, process 300 may be performed by one or several of loudspeaker cabinets 130*a*-130*d*, as described in FIG. 1. In FIG. 3, process 300 begins by initializing (at block 305) the P2P distributed wireless network (e.g., BLUETOOTH or wireless local area network). This operation may be in response to receiving a request from the listener 140 to stream an audio signal of a particular piece of audio content to one or more of the loudspeaker cabinets 130*a*-130*d*. Such a request may be performed through a multimedia application running on a mobile device (e.g., smartphone or tablet computer) that transmits the request to the loudspeaker cabinets. To initialize the network, each of the cabinets may perform a network discovery protocol that identifies each of these respective loudspeaker cabinets by their respective addresses. These addresses may be stored at each cabinet based on previously established wireless networks, while other addresses may be acquired at the time of initialization. In one embodiment, the loudspeaker cabinet may emit a signal beacon to discover new loudspeaker cabinets and to acquire their addresses. Once the addresses are identified, the loudspeaker cabinets may begin communicating with each other. In one embodiment, this task is performed using data packets similar or identical to data structures described in FIG. 4.

The process 300 chooses (at block 315) one of the loudspeaker cabinets within the network as the master loudspeaker cabinet that will fetch and distribute an audio signal to the other loudspeaker cabinets. As the network has recently been initialized, the loudspeaker cabinets may have been dormant (e.g., in a power save mode). As loudspeaker cabinets in power save mode have not been performing rigorous operations, they do not have high internal temperatures. Therefore, as most cabinets will have high master ranks (or a high desire to be master), in response to having low internal temperatures, the master may be chosen at random, as each of the cabinets are potential candidates. However, in one embodiment, the master may be chosen based on the master rank; and if there are ties in the master rank, the system may use various means as tie breakers. For instance, if several loudspeaker cabinets have the same master rank, the loudspeaker cabinet with the highest (or lowest) MAC address (or last four bytes of the MAC address) may be chosen.

The selection of the master loudspeaker cabinet may be performed implicitly between the loudspeaker cabinets, rather than explicitly. For instance, as the loudspeaker cabinets are communicating, they are exchanging data (e.g., “keep-alive”) packets in order to maintain the network. Within these keep-alive packets includes information, such as a current master rank (or desire to be master) of the loudspeaker cabinet emitting the packet. More about the keep-alive packets are discussed in FIG. 4 below. Therefore, as each of the loudspeaker cabinets knows the master rank of every other loudspeaker cabinet, all loudspeaker cabinets know implicitly who will take up the role as master. This is in contrast to performing a formal negotiation between candidate cabinets (e.g., cabinets requesting master rank information, comparing master ranks, and informing a candidate that it will take up the master role). In one embodiment, the decision to take a master role may be based on other information. However, in other embodiments, the decision may be explicit and require a formal negotiation between cabinets in order to choose the master. Once the master is chosen, the master begins to retrieve the audio signal (e.g., from the audio source 120) and stream (at block 320) the audio signal to the slaves in order for the slaves (along with potentially the master) to playback the audio signal.

Figure 4:
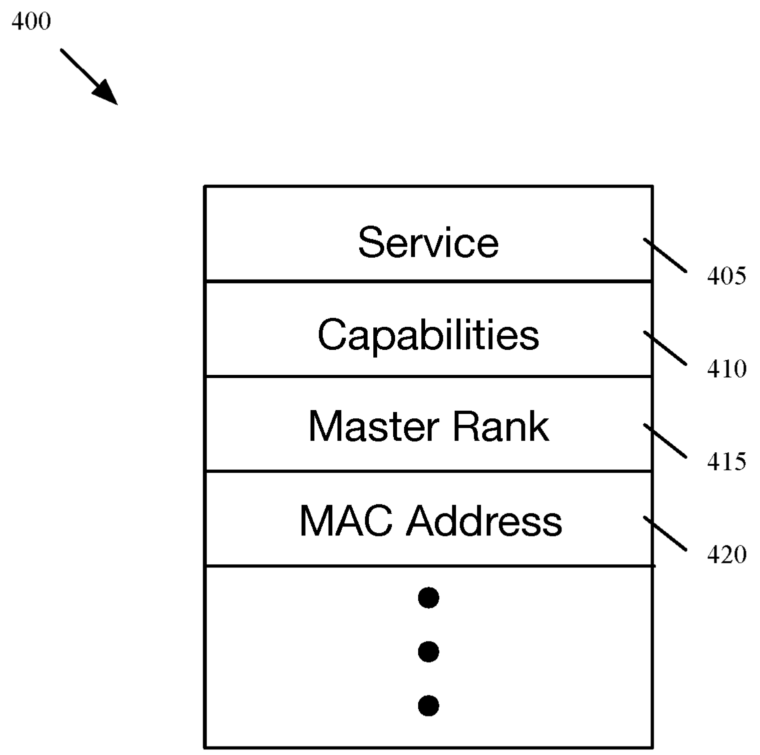
FIG. 4 shows an example of a data structure of data packets that are exchanged between loudspeaker cabinets within a distributed wireless audio system.

FIG. 4 shows one example of a data structure 400 of a keep-alive data packet (e.g., messages) that is exchanged between cabinets in order to maintain the P2P distributed wireless network. These data packets not only ensure that a connection between the cabinets is preserved, but also carries useful parameters relating to the cabinet transmitting the data packet. This data structure 400 includes a service 405, capabilities 410, master rank (or desire to be master) 415, and MAC address 420. The service 405 includes the type of protocol (e.g., AirPlay) the cabinet is using to exchange data over the wireless network. Exchanging the service 405, ensures that the cabinets communicate with each other using a common service so that data is exchanged in an organized fashion, without any misinterpretation. The capabilities 410 describe what tasks the cabinet distributing the data structure 400 can perform. For instance, the capabilities 410 may indicate the processing capacity of the controller or signal processing abilities or both within the cabinet. Knowing the signal processing abilities, as previously described, certain tasks may be distributed within the network (e.g., adjusting the spectral shape of the audio signal). The capabilities may also include the specifications of the transducer(s) within the cabinet. For instance, a cabinet may communicate that its transducer is not well suited for playing low frequency content (e.g., because the transducer is a tweeter) and therefore, a different cabinet may than take up the task.

The master rank (or desire to be master) 415, as previously described, indicates how likely a particular cabinet will take on the role as master, with respect to the other cabinets within the network. The master rank 415 may be a number (e.g., between 1-10; "1" being least likely or least desire to be master and "10" being most likely or most desire to be master), a ratio, or any type of indication that the cabinet may (or may not) want to be master. The master rank 415 may be computed based on internal temperature, power consumption data of the cabinet, or both. For example, the master rank 415 may be proportional to the difference between one of (1) a current internal temperature and a threshold temperature and (2) current energy of true power or power consumption and a power budget (e.g., an energy or power consumption threshold). In one embodiment, the master rank may be predefined based on the current temperature and/or the current power usage. More about defining the master rank is discussed in FIG. 5. The media access control ("MAC") address 420 is a unique identifier assigned to the cabinet for communicating within the network. In one embodiment, as the MAC address 420 is unique; it may be used to break ties between cabinets that have similar master ranks, as previously described.

As the parameters described in the data structure 400 of FIG. 4 are illustrative, in one embodiment, the data structure 400 can include additional information. For instance, it can include timestamp information in order for the cabinets to synchronize their internal clocks. The data structure 400 can also include the current tasks being performed by the cabinet. For example, the tasks can indicate (1) the particular audio signal of audio content being streamed and played back at the cabinet and (2) which signal processing operations the cabinet is responsible for. Also, in one embodiment, the data structure 400 can include information of whether the cabinet is in a "group" of cabinets that all playback similar audio content in a single room. For example, a data structure from cabinet 130*a*, of FIG. 1, may indicate that audio content is being shared with cabinet 130*d* and that cabinet 130*a* is a left channel, while cabinet 130*d* is a right channel. While an audio signal of a piece of audio content is being streamed by the master loudspeaker cabinet, in one embodiment, the data structure 400 may also include audio data. For example, a data structure of the master loudspeaker cabinet may include audio data, in order to distribute the audio signal to the other cabinets in the system. In another embodiment, however, the audio data is distributed separately. Furthermore, the data structure 400 may include information that indicates which cabinets are slaves to a particular cabinet. Moreover, the data structure 400 may include information used to determine the master rank. For instance, in one embodiment, the data structure 400 includes (1) a (current) power budge, (2) a current power usage, (3) a current internal temperature, and (4) a thermal threshold of the cabinet. In one embodiment, some of this additional information is secondary considerations used by the cabinets to determine how (if at all) to distribute the master role. More about secondary considerations is described in FIGS. 7-8.

In one embodiment, keep-alive data packets are distributed repeatedly upon initialization of the P2P distributed wireless network. For instance, in order to ensure that the network is maintained, each cabinet sends the keep-alive data packets in regular intervals (e.g., every second). In another embodiment, these packets are transmitted after the establishment of the network, regardless of whether an audio signal is being streamed.

Figure 5:
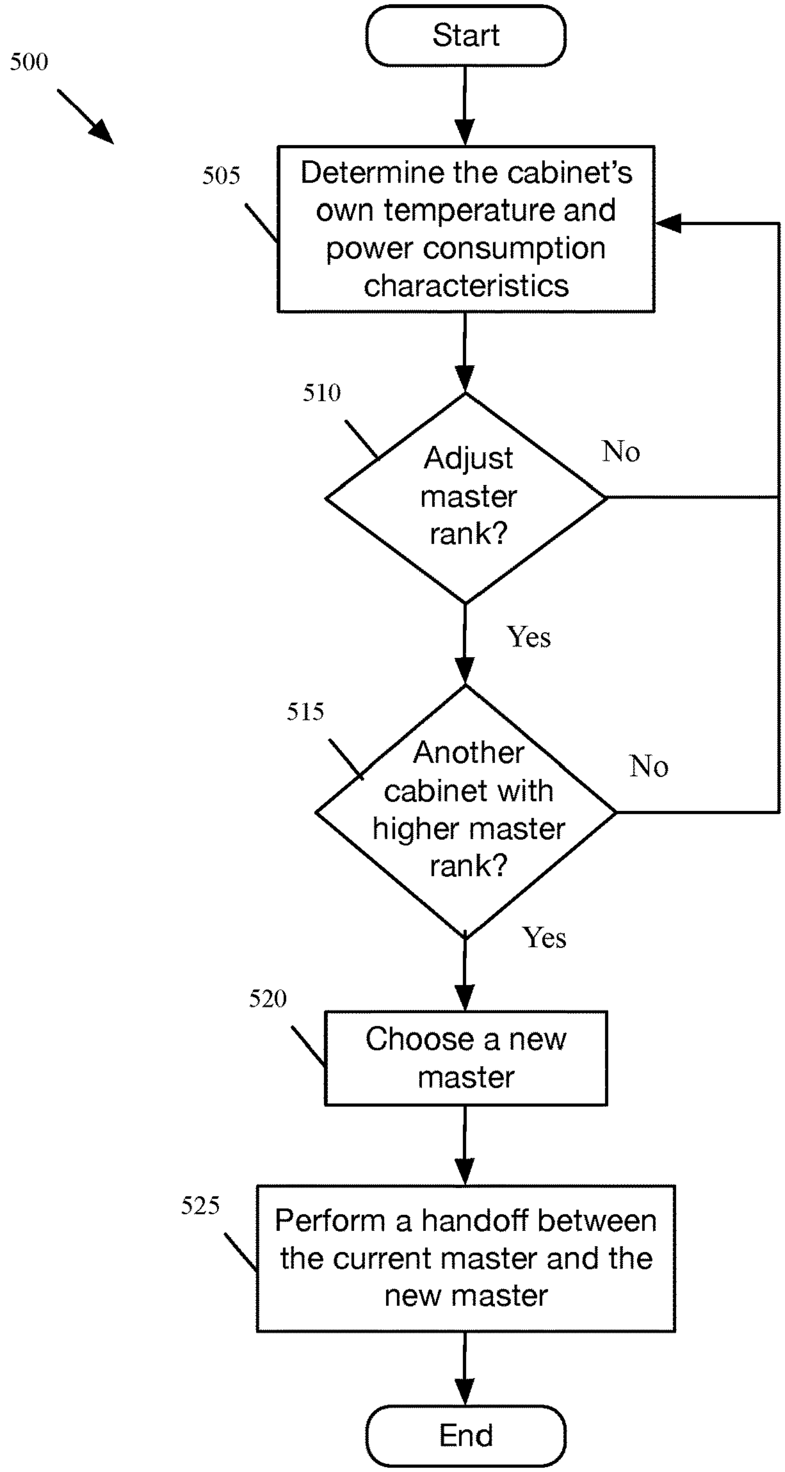
FIG. 5 is a flowchart of one embodiment of a process to handoff the master role from one loudspeaker cabinet to another.

FIG. 5 is a flow chart of one embodiment of a process 500 to perform dynamic reassignment of a master role from one loudspeaker cabinet to another loudspeaker cabinet. The process of 500 is performed by loudspeaker cabinet 130*a*, as described in FIG. 1, while acting as master by streaming at least one audio signal of a piece of audio content to one or more slave loudspeaker cabinets. In one embodiment, however, process 500 can be performed by any of loudspeaker cabinets 130*a*-130*d*, while the audio signal is being streamed. In one embodiment, loudspeaker cabinets performing this process are not streaming an audio signal (e.g., not requested to playback audio by listener 140) but are still communicating within the P2P distributed wireless network.

As shown in FIG. 5, process 500 begins by determining (at block 505) the cabinet's own internal temperature and power consumption data (e.g., current energy of true power or power consumption). As previously described, the thermal sensor 215 of FIG. 2 may take a measurement of the internal temperature in order to make this determination. This internal temperature may be representative of an ambient internal temperature (e.g., temperature of air) within the cabinet, a temperature of a particular component of the cabinet (e.g., the controller 210 or the voice coil of the transducer 225), or an external temperature (e.g., a temperature of an outside wall) of the cabinet, as previously described in FIG. 2. The power consumption data is a total amount of power currently being used by the cabinet. Each cabinet has a current power consumption that includes power used by audio subsystems (e.g., used to playback audio signal), a Wi-Fi subsystem (e.g., used to stream the audio signal), and other general subsystems within the cabinet (e.g., light emitting diode (LED) light(s), display(s), and CPU). As each slave (and master) may be performing differing tasks, however, the power consumed by these subsystems may vary. For the master, however, the current power consumption may be greater than the slaves because of the network master responsibility. For example, the Wi-Fi subsystem of the master may consume a greater amount of power because rather than just streaming the audio signal for playback, it must also retrieve and distribute the audio signal to other cabinets. In one embodiment, the power consumption data represents energy or power in any standard unit (e.g., Watts, Joules, and Amperes).

The process 500 determines (at block 510) whether to adjust the master rank and by how much. The process 500 makes this determination based on either the current internal temperature or current power consumption or both. For instance, if the current internal temperature exceeds a thermal threshold, the master rank may be reduced in order to indicate to other cabinets that this particular cabinet is least likely to take on (or continue to take on) the master role. The thermal threshold, in one embodiment, is a temperature limit of the same element in which the thermal sensor 215 took the temperature measurement. For example, if the thermal sensor 215 measured the ambient internal temperature of the loudspeaker cabinet 130*a*, then the thermal threshold would be a temperature limit of the ambient internal temperature. In one embodiment, if the measured ambient internal temperature meets (or exceeds) the thermal threshold, the cabinet may be deemed too hot to continue as the master, and therefore, may reduce its master rank in order to relinquish its role as master to another cooler cabinet. On the other hand, if the current power consumption meets a maximum amount of power budget that the device may exert (e.g., based on a power supply of the cabinet), then the master rank may also be reduced. In one embodiment, the current power consumption is related to the internal temperature. For example, as internal temperature increases (e.g., based on component performance or external heating), the power budget of the device may decrease to reduce the possibility of over heating due to additional component performance. An example of this is further discussed in FIG. 6. In another embodiment, the determination of whether to adjust the master rank can be based on other factors. If neither the internal temperature exceeds the thermal threshold nor the current power consumption stays below the power budget, then the process 500 returns to 505, as the cabinet can continue operating with the same master rank.

Otherwise, once the determination has been made that the master rank must be adjusted (e.g., based on exceeding the thermal threshold or the power consumption meeting the power budget, or both), the process 500 determines how much the master rank must be adjusted. This may be performed in many ways. For instance, the master rank may be adjusted by a predefined amount, or in proportion to the difference between at least one of (1) a current internal temperature and a threshold temperature and (2) a current power consumption and a power budget. In one embodiment, the reduction of the master rank may be exponential. For example, once the master determines the internal temperature exceeds (or is about to exceed) the thermal threshold, it may reduce the master from 10 (being more likely to be master) to 9. As time goes on, and the internal temperature does not decrease (or rather continues to increase), the master rank may then be adjusted from 9 to 6. In another embodiment, the master rank may increase due to changes to the internal temperature, power consumption, or both, rather than decrease. For instance, as the current internal temperature decreases, getting further away from the thermal threshold, the master rank will increase (e.g., from 6 to 7).

The process 500 determines (at block 515) whether there is another cabinet with a higher master rank than the current cabinet. This determination may be based on a numerical comparison between other master ranks that the current cabinet receives with the keep-alive packets described in FIG. 4. If the process 500 does not identify a higher master rank belonging to a different cabinet, the process 500 returns to 505. Otherwise, if there is another cabinet with a higher master rank, the process 500 chooses (at block 520) the cabinet with the higher master rank to take on the role of master. The process 500 performs (at block 525) a handoff of the network master responsibility between the current master cabinet and the new master cabinet. This handoff may entail directing the new master cabinet to retrieve and distribute the audio signal to the other cabinets, including the previous master cabinet. Once the handoff is complete, the process 500 ends.

Some embodiments perform variations of the process 500. For example, the specific operations of the process 500 may not be performed in the exact order shown and described. The specific operations may not be performed in one continuous series of operations, and different specific operations may be performed in different embodiments. For instance, in one embodiment, rather than the process 500 proceeding to block 505 once a determination has been made that the master rank does not need to be adjusted (at block 510), the process 500 determines whether there is another cabinet with a higher master rank (at block 515). This may occur because although the master rank may not change in a current cabinet, a different cabinet may have adjusted its master rank (e.g., due to experiencing better conditions).

Figure 6:
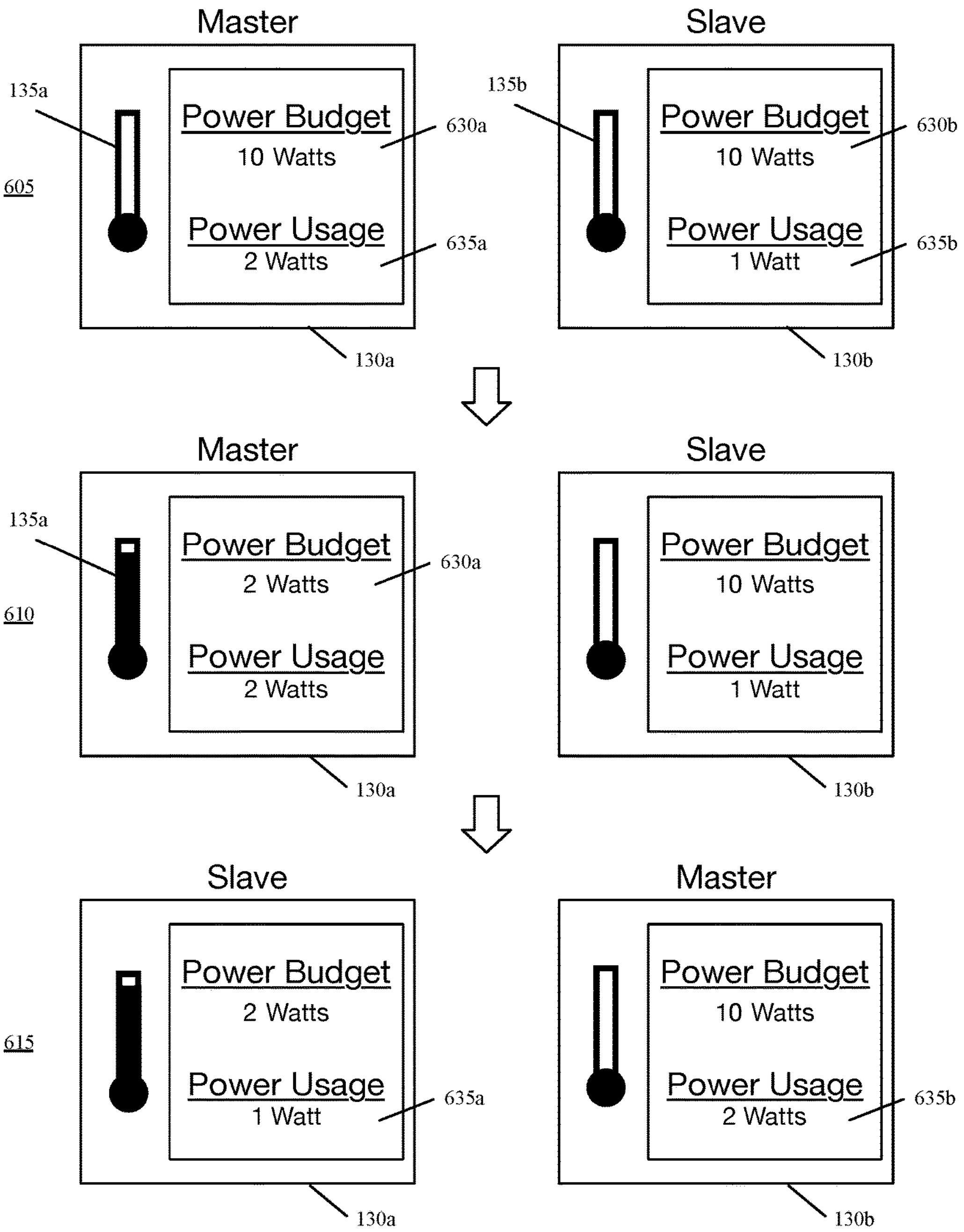
FIG. 6 shows a progression of various states in two loudspeaker cabinets, leading to relinquishing the master role from one to the other.

FIG. 6 illustrates a master loudspeaker cabinet 130*a* relinquishing its master role to another (e.g., slave) loudspeaker cabinet 130*b* of some embodiments. Specifically, this figure illustrates three stages 605-615 in which the master loudspeaker 130*a* relinquishes its master role based on changes to internal temperature and power budget. Furthermore, this figures shows that the power budget (e.g., energy or power consumption threshold) is different than the thermal threshold, such that it is variable and varies based on a current internal temperature of the cabinet.

The master loudspeaker 130*a* includes the internal temperature reading 135*a*, a power budget 630*a*, and a power usage 635*a*. Similar to the master loudspeaker, the slave loudspeaker 130*b* includes the internal temperature reading 135*b*, a power budget 630*b*, and a power usage 635*b*. The internal temperature readings 135, as described in FIG. 1, indicates the internal temperature of the respective cabinet. The budgets 630 represent the total amount of power a respective cabinet may use to perform various activities. The usages 635 represent the total power consumption of the respective cabinet. For instance, as described in FIG. 2, these amounts include power used by the audio subsystems, the Wi-Fi subsystem, and the other general subsystems. In addition to power used for the previously-mentioned subsystems, the usage 635*a* of the master also includes any additional power related to the network master responsibility (e.g., increased performance by the Wi-Fi system and managing the slave cabinets).

Stage 605 illustrates the internal temperature and power consumption of loudspeaker cabinets 130*a*-130*b* while an audio signal is being streamed. In this case, master cabinet 130*a* is fetching and distributing the audio signal to slave cabinet 130*b*, as described in FIG. 1. The internal temperature 135*a* of master 130*a* is low (as illustrated by the mercury being in the bulb of the thermometer representation) and the difference between the power budget 630*a* and the power usage (e.g., power consumption data) 635*a* is 8 Watts. This difference indicates the amount of power the master cabinet can use for other tasks. For instance, with this additional power, the cabinet can perform additional signal processing to improve audio quality, and fetch and distribute more audio signals, to just name a few. The slave cabinet 130*b* is similar to the master cabinet 130*a*. In particular, the internal temperature 135*b* is low (as illustrated by the mercury being in the bulb of the thermometer representation). The slave 130*b* differs, however, in that the difference between the power budget 630*b* and the power usage 635*b* is 9 Watts. This increased difference may account for the fact that the slave 130*b* is not performing the additional network master responsibility that the master 130*a* is tasked to perform. In other words, in order to perform the network master responsibility, cabinet 130*a* exerts 1 Watt of power more than cabinet 130*b*. In one embodiment, rather than both cabinets having the same power budget (e.g., 10 Watts), each cabinet can have different power budgets based on, for example, the cabinets being of different sizes with transducers that have different ratings.

Stage 610 illustrates that the internal temperature 135*a* of the master 130*a* has increased, and in response, the budget 630*a* has been decreased. Examples of what may cause the increase in internal temperature include (1) increased performance of the driver of the transducer within the cabinet (e.g., caused by volume being increased), (2) additional signal processing tasks being performed by the cabinet, (3) the additional network master responsibility, (4) increased external temperature, and (5) an accumulation of heat caused by operations currently being performed. In response to the increased internal temperature (e.g., the internal temperature meeting or exceeding the thermal threshold), the power budget 630*a* of the master 130*a* has been reduced from 10 Watts to 2 Watts. By varying (e.g., decreasing or increasing) the budget, the cabinet is managing the internal temperature. For instance, as any additional potential tasks that the master 130*a* takes on will require components within the master to use more power, these components will emit additional heat. Therefore, the cabinet 130*a* reduces the budget 630*a* in response to the increased internal temperature 135*a* to limit its internal components from (i) performing these additional tasks and/or (ii) increasing current performance. Otherwise, if the budget is not reduced, in one embodiment, there may be adverse effects on the performance of the cabinet or even damage. The amount in which the budget 630*a* is reduced may be computed in various ways. For instance, the reduced amount may be (1) a predefined amount or (2) proportional to a difference between the increased temperature and the thermal threshold, or both. In this case, the power usage 635*a* is now the same as the power budget 630*a*, 2 Watts. Unlike the master 130*a* that is experiencing an increase in internal temperature, the internal temperature 135*b* of the slave 130*b* remains relatively the same.

As a result of the reduced budget 630*a* meeting the power usage 635*a*, of 2 Watts, in the stage 615, cabinet 130*a* has relinquished the master role to cabinet 130*b*. Now that cabinet 130*a* is no longer performing the network master responsibility, the power usage 635*a* is reduced to 1 Watt. Although the internal temperature 135*a* is still high, the reduction in computations being performed by cabinet 130*a* may reduce this temperature over time. As cabinet 130*b* is now the master, the power usage 635*b* has increased from 1 Watt to 2 Watts.

In addition to the master role moving between cabinets based on the internal temperature and power consumption, as previously described, the master role may also be given (or shared) between one or several cabinets based on additional factors (e.g., secondary considerations). For instance, rather than a master role moving from one cabinet to another, the master role may be shared between a master cabinet and at least one slave cabinet in order to change the topology of the P2P distributed wireless network, such that the slave cabinet distributes at least some of the audio signal to other cabinets in order to reduce stress on the master cabinet. In another embodiment, the master role may be rotated (e.g., switched) between two or more cabinets according to a predetermined schedule (e.g., being maintained by a particular cabinet for a certain amount of time). Or, a cabinet may maintain the master role, even though doing so may degrade audio quality. To make these decisions, cabinets may consider, for example, at least one of (1) the audio signal being streamed, (2) whether other cabinets have the ability to share the role (e.g., can take on a portion of the role without exceeding a power budget or a thermal threshold, as previously described), and (3) the fact that no other cabinet can take on the responsibility without creating adverse consequences (e.g., reduction in audio quality).

Figure 7:
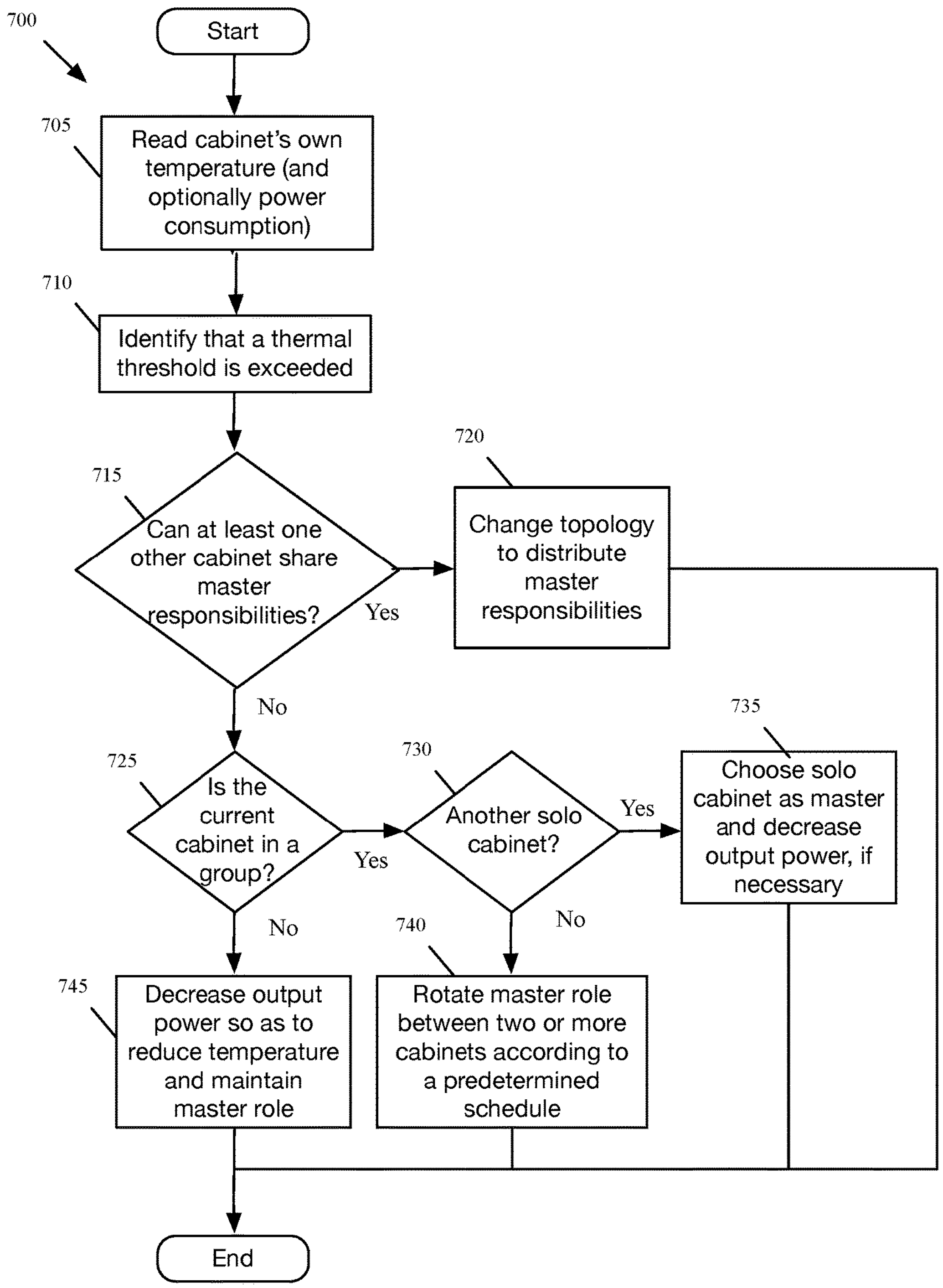
FIG. 7 is a flowchart of one embodiment of a process to share the master role between several loudspeaker cabinets.

FIG. 7 is a flowchart of one embodiment of a process 700 in which secondary considerations are used to determine whether a master role may be shared or maintained by a single cabinet. The process 700 will be described by reference to FIGS. 1 and 8. For example, process 700 is being performed by cabinet 130*a*, while this cabinet is master, as described in FIG. 1. In one embodiment, however, the process 700 may be performed by one or several loudspeaker cabinets 130*a*-130*d*, regardless of role. In FIG. 7, process 700 begins by reading (at block 705) the internal temperature of the cabinet, along with the power usage of the cabinet. The process 700 identifies (at block 710) that the cabinet's internal temperature has exceeded the thermal threshold. Up to this point, process 700 is similar to process 500, such that both processes determine the internal temperature. Unlike process 500, however, that may adjust the master rank in response to meeting the thermal threshold, process 700 does not adjust the master rank. In one embodiment, this may be due to the fact that it is known that all cabinets within the P2P distributed wireless network already have low master ranks based on (1) high internal temperatures and/or (2) little available power to perform additional tasks. And rather than adjusting the rank, which would do little to determine the master (e.g., because all cabinets have a master rank of 1), process 700 determines (at block 715) whether there is another cabinet that can share the network master responsibility. The process 700 makes this determination based on knowledge of (1) how much power is used to perform the network master responsibility and (2) how much power is available for use by each of the other cabinets. If at least one other cabinet can share the network master responsibility, the process changes (at block 720) the topology of the P2P distributed wireless network in order to give that one cabinet some of the network master responsibility. In one embodiment, however, the master rank may also be adjusted, like as described in FIG. 5.

Figure 8:
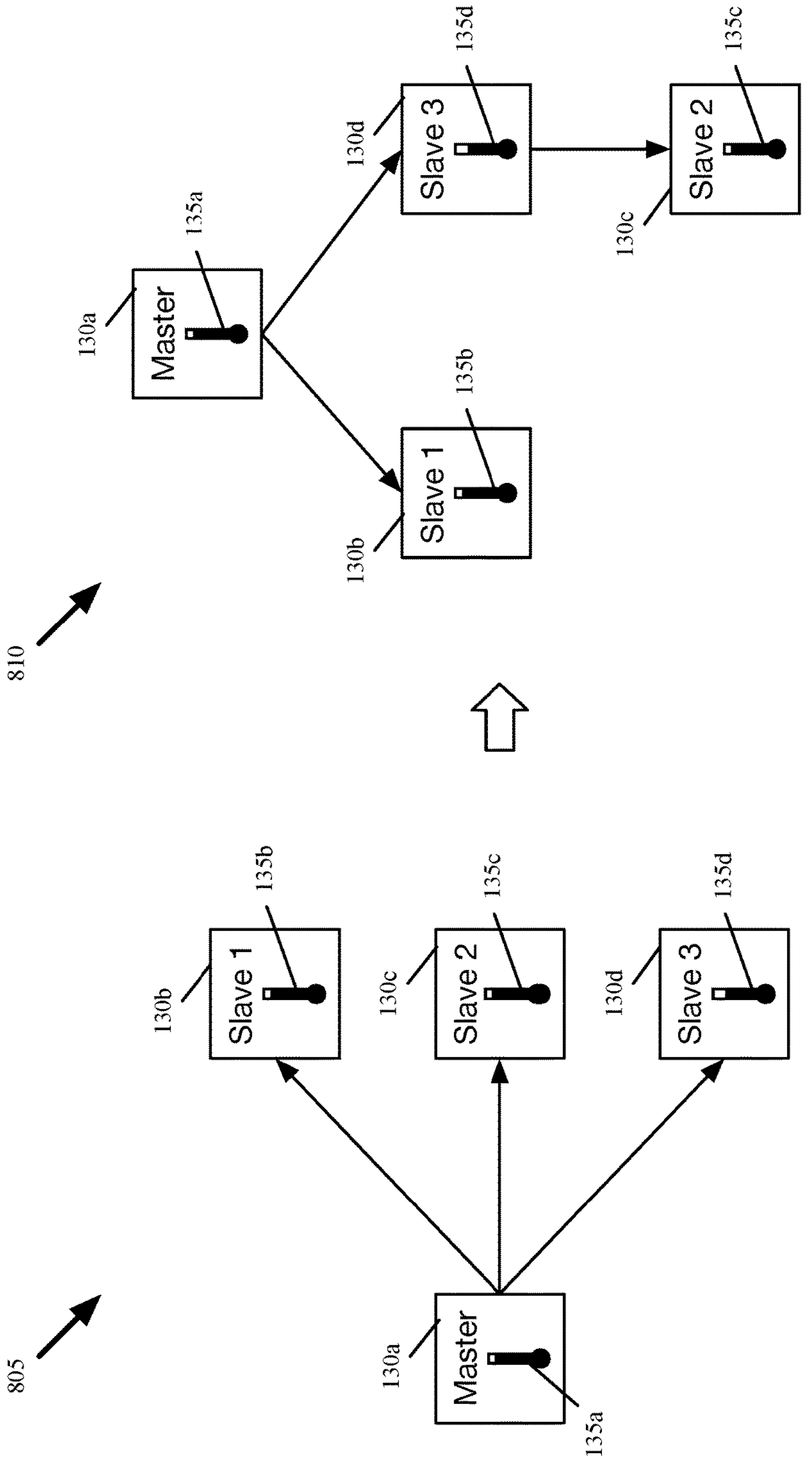
FIG. 8 shows a change in a topology of a distributed P2P wireless network by sharing a master role between several loudspeaker cabinets according to one embodiment of the invention.

FIG. 8 illustrates an example of changing the topology of the P2P distributed wireless network in response to increased internal temperature at two stages 805-810 that show master cabinet 130*a* sharing the network master responsibility with cabinet 130*d*. Specifically, the network master responsibility shared with cabinet 130*d* is the responsibility of receiving and distributing an audio signal to cabinet 130*c*. In essence, cabinet 130*d* is acting as an intermediary between master cabinet 130*a* and slave cabinet 130*c*. Stage 805 illustrates cabinet 130*a* as master that is distributing an audio signal to slave cabinets 130*b*-130*d*, similar to stage 105 of FIG. 1. Unlike FIG. 1, however, cabinet 130*b* does not have a low internal temperature, which would allow 130*b* to become the master, but instead has an increased internal temperature 135*b*. Cabinet 130*b*'s internal temperature 135*b* is so high in fact, that if this cabinet were to take on the entire network master responsibility, the internal temperature would surely exceed the thermal threshold (e.g., due to power requirements to perform the network master responsibility). Cabinet 130*d*, on the other hand, has a lower internal temperature 135*d* than cabinets 130*b* and 130*c*, but not low enough to take on the full network master responsibility. Both of these determinations may be based on knowledge of the amount of power required to perform the network master responsibility and the available power for use by each of the cabinets 130*b*-130*d* (e.g., power difference between a current power usage of the cabinet and its power budget). In one embodiment this determination is also based on the current master rank of the cabinets.

Stage 810 illustrates that cabinet 130*a* has shared some (e.g., a portion) of the network master responsibility with cabinet 130*d*, allowing cabinet 130*a* to still distribute at least some of the audio signal to slave cabinets 130*b* and 130*d* (e.g., a first subset of cabinets) and allowing cabinet 130*d* to distribute at least some of the audio signal received from cabinet 130*a* to slave cabinet 130*c* (e.g., a second subset of cabinets). Cabinet 130*d* will perform this responsibility in addition to any other tasks that it has already performed, or going to perform (e.g., playing back audio through its transducer). By allowing cabinet 130*d* to take on some of the network master responsibility, this will reduce power usage (and thereby reduce internal temperature) at cabinet 130*a*. For example, looking at the distribution of cabinets 130*a*-130*d* in FIG. 1, in order for cabinet 130*a* to distribute the audio signal to cabinet 130*c*, a strong RF signal, generated by network interface block 205, is required for data packets to reach this cabinet. However, for cabinet 130*a* to reach cabinet 130*d*, a relatively weaker RF signal is required because cabinet 130*d* is closer to 130*a*. Therefore, by using cabinet 130*d* to distribute the audio signal to cabinet 130*c*, cabinet 130*a* may generate a weaker RF signal, which requires less power than if it were to try to reach every cabinet. Hence, by sharing the network master responsibility with cabinet 130*d*, cabinet 130*a* may manage the internal temperature. In one embodiment, rather than cabinet 130*d* receiving at least some of the audio signal from cabinet 130*a* for distribution, cabinet 130*d* may retrieve the audio signal directly from the source 120.

Referring back to FIG. 7, when process 700 determines that there isn't at least one other cabinet that can share the network master responsibility (due to each cabinet having a high internal temperature and/or little available power to perform additional tasks), the process 700 determines (at block 725) whether the current cabinet is in a group. As previously described, a "group" of loudspeaker cabinets may be defined as several cabinets that are playing an audio signal of the same (or similar) piece of audio content in a room. For example, cabinets 130*a* and 130*d* are in a group, as both cabinets are playing back an audio signal of a piece of audio content in room 102 for listener 140. In this group, cabinet 130*a* plays back a left audio channel, while cabinet 130*d* plays back a right audio channel. In another embodiment, each cabinet in the group may playback a same channel, or group of channels. In one embodiment, cabinets in separate rooms may be in the same group. When the current cabinet is not in a group, process 700 decreases (at block 745) power usage so as to reduce internal temperature and maintain the entire master role in this particular cabinet. To decrease the power usage, the cabinet can reduce operations performed at the cabinet. For example, the cabinet can reduce the audio quality during playback of the audio signal by (1) ceasing to perform certain signal processing operations and/or (2) reducing the overall volume of the audio output.

When the process 700 determines that the cabinet is in a group, however, the process 700 (at block 730) determines whether there is another single cabinet within the P2P distributed wireless network. When there is a single cabinet, the process 700 chooses (at block 735) the single cabinet to take on the master role and decrease its output power (as described at block 745) if necessary to perform the master role. In one embodiment, if there are several single cabinets, this determination may be based on any of the previously mentioned criteria. For instance, the cabinet with the highest master rank or most available power may take on this role. It is preferable for a single cabinet to decrease its output power, rather than a cabinet within a group. For example, looking at FIG. 1, if none of the cabinets 130*a*-130*d* were able to take on the master role (individually) without requiring reduced power output, it is preferable to have one of the single cabinets 130*b* or 130*c* to take on the role (and reduce power output) rather than one of the cabinets (130*a* and 130*d*) in the group. Because if there is a reduction in output power by one of the cabinets in the group, the reduction would create an imbalance of audio output between the two cabinets. To illustrate, if the output power of cabinet 130*a* were to be reduced, than the audio quality would most likely suffer. Therefore, as cabinet 130*d* is playing back the audio signal of the same piece of audio content (but a different audio channel), the listener 140 would notice an imbalance in audio quality (e.g., one cabinet outputting audio at a higher volume than the other). With a single cabinet, however, the reduction in audio quality would be less noticeable because there is only one cabinet playing back the audio.

When the process 700 determines however that there isn't another single cabinet, the process 700 rotates (at block 740) the network master responsibility between two or more cabinets within the group according to a predetermined schedule. Rather than maintaining a single cabinet as master, in one embodiment, the role as master may switch between at least two cabinets to reduce the total power required for performing master responsibilities. To illustrate, looking at FIG. 1, assuming that cabinets 130*a* and 130*d* have power budgets of 16 Watts, but have a current power usage of 15 Watts for subsystems (e.g., audio, Wi-Fi, and general), other than the network master responsibility, If the network master responsibility were to require 2 Watts for either cabinet to take on the master role, neither cabinet would be able to take on network master responsibility because either one's usage would exceed their budget (e.g., 2 Watts+15 Watts=17 Watts). Therefore, rather than one cabinet within the group take on the whole responsibility, the master role can switch between the two cabinets according to a predetermined schedule (e.g., "Ping-Pong" between the cabinets). The schedule may indicate that each cabinet have the network master responsibility for a certain amount of time (e.g., 5 seconds). As the responsibility moves back and forth between the cabinets, rather than requiring 2 Watts to perform the master role, in one embodiment, it may be averaged to 1 Watt between the two cabinets, which combined with the usage of 15 Watts would match either of their power budgets without going over.

Some embodiments perform variations of the process 700 of FIG. 7. For example, the specific operations of the process 700 may not be performed in the exact order shown and described. The specific operations may not be performed in one continuous series of operations, and different specific operations may be performed in different embodiments. For instance, in one embodiment, the process 700 may be performed in conjunction with process 500 of FIG. 5. For example, rather than the process 500 choosing a new master (at block 520), process 700 may be performed in order to determine whether the network master responsibility may be shared, rather than performed by a single cabinet. This may occur in order to find an optimal combination of cabinets to take on the master role.

Other embodiments of the invention perform other operations to manage the internal temperature of cabinets either in lieu of or in addition to distributing the master role described in processes 300 and 700 of FIGS. 3 and 7. In one embodiment, a cabinet, within a group, which is tasked to output certain audio may request another cabinet to playback the audio instead. Doing so reduces audio processing operations on the original cabinet, thereby decreasing internal temperature. To illustrate, looking at FIG. 1, stage 110, recall that cabinet 130*a* (that is in a group with 130*d*) relinquished its network master responsibility because the internal temperature met (e.g., exceeded) the thermal threshold. Instead of relinquishing the network master responsibility, however, cabinet 130*a* may request cabinet 130*d* to playback an audio signal within certain frequencies in an attempt to decrease internal temperature. For instance, low frequency content (e.g., bass) within the audio signal is not directional (e.g., does not matter which cabinet outputs bass), cabinet 130*a* can reduce bass, while cabinet 130*d* increases bass output without impacting the listener's experience. Hence, cabinet 130*a* manages the internal temperature by reducing bass output, which otherwise would put a heavy burden on the driver of the cabinet's transducer, as described in FIG. 1. In one embodiment, any cabinet (e.g., master or slave) within a group may rotate audio frequencies in order to manage internal temperature.

As previously explained, an embodiment of the invention may be a non-transitory machine-readable medium (such as microelectronic memory) having stored thereon instructions, which program one or more data processing components (generically referred to here as a "processor") to perform the digital signal processing operations previously described including receiving temperature data, determining whether a thermal threshold has been met, giving up network master responsibility, spectral shaping, filtering, addition, subtraction, inversion, comparisons, and decision making. In other embodiments, some of these operations might be performed by specific hardware components that contain hardwired logic (e.g., dedicated digital filter blocks). Those operations might alternatively be performed by any combination of programmed data processing components and fixed hardwired circuit components.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for operating a distributed wireless audio system comprising a plurality of loudspeaker cabinets all of which can communicate with each other as part of a computer network, the method comprising:

receiving temperature data that is indicative of temperature of a first loudspeaker cabinet of the plurality of loudspeaker cabinets while the first loudspeaker cabinet is playing back some of an audio signal, wherein the first loudspeaker cabinet has a network master responsibility of obtaining the audio signal from an audio source and wirelessly transmitting some of the audio signal to a second loudspeaker cabinet of the plurality of loudspeaker cabinets, for playback by the second loudspeaker cabinet;

determining whether a thermal threshold of the first loudspeaker cabinet has been reached, based on the temperature data; and in response to the thermal threshold being reached, giving up the network master responsibility from the first loudspeaker cabinet to the second loudspeaker cabinet, wherein doing so reduces temperature in the first loudspeaker cabinet.

2. The method of claim 1, wherein giving up the network master responsibility to the second loudspeaker cabinet comprises ceasing, at the first loudspeaker cabinet, to (i) obtain the audio signal from the audio source and (ii) wirelessly transmit the audio signal to the second loudspeaker cabinet.

3. The method of claim 2 further comprising receiving, from the second loudspeaker cabinet, some of the audio signal for playback at the first loudspeaker cabinet, wherein the audio signal is now obtained from the audio source by the second loudspeaker cabinet and not by any others of the plurality of loudspeaker cabinets.

4. The method of claim 1, wherein the first loudspeaker cabinet has a master rank, the method further comprising reducing the master rank of the first loudspeaker cabinet, based on the temperature data indicating an increase in the temperature of the first loudspeaker cabinet.

5. The method of claim 4 further comprising repeatedly receiving a message from the second loudspeaker cabinet containing a master rank of the second loudspeaker cabinet, wherein giving up the network master responsibility comprises determining that the second loudspeaker cabinet is to be given the network master responsibility based on the master rank of the first loudspeaker cabinet being lower than the master rank of the second loudspeaker cabinet.

6. The method of claim 1, wherein the first loudspeaker cabinet has a master rank, the method further comprising receiving power consumption data that is indicative of a power consumption level of the first loudspeaker cabinet; and reducing the master rank of the first loudspeaker cabinet, based on the power consumption data indicating an increase in the power consumption level of the first loudspeaker cabinet.

7. The method of claim 6, wherein the power consumption data has been sensed or measured in the first loudspeaker cabinet.

8. The method of claim 7, wherein the temperature data has been sensed or measured in the first loudspeaker cabinet and has different units than the power consumption data.

9. The method of claim 1, wherein giving up the network master responsibility from the first loudspeaker cabinet to the second loudspeaker cabinet comprises sharing a portion of the network master responsibility with the second loudspeaker cabinet, such that the second loudspeaker cabinet wirelessly transmits some of the audio signal to a first subset of the plurality of loudspeaker cabinets for playback, while the first loudspeaker cabinet wirelessly transmits some of the audio signal to a second subset of the plurality of loudspeaker cabinets for playback.

10. The method of claim 1, wherein giving up the network master responsibility from the first loudspeaker cabinet to the second loudspeaker cabinet comprises rotating the network master responsibility between the first and second loudspeaker cabinets, such that each cabinet retains the network master responsibility according to a predetermined schedule.

11. An article of manufacture comprising a non-transitory machine readable medium storing instructions which when executed by a processor receive temperature data that is indicative of temperature of a first loudspeaker cabinet of a plurality of loudspeaker cabinets all of which can communicate with each other as part of a computer network, wherein the temperature data is received while the first loudspeaker cabinet is playing back some of an audio signal, wherein the first loudspeaker cabinet has a network master responsibility of obtaining the audio signal from an audio source and wirelessly transmitting some of the audio signal to a second loudspeaker cabinet of the plurality of loudspeaker cabinets, for playback by the second loudspeaker cabinet;

determine whether a thermal threshold of the first loudspeaker cabinet has been reached, based on the temperature data; and in response to the thermal threshold being reached, cease to (i) obtain the audio signal from the audio source and (ii) wirelessly transmit the audio signal to the second loudspeaker cabinet, wherein doing so reduces temperature in the first loudspeaker cabinet.

12. The article of manufacture of claim 11, wherein the non-transitory machine readable medium further comprises instructions that when executed by the processor cause the first loudspeaker to receive, from the second loudspeaker cabinet, some of the audio signal for playback at the first loudspeaker cabinet, wherein the audio signal is now obtained from the audio source by the second loudspeaker cabinet and not by any others of the plurality of loudspeaker cabinets.

13. The article of manufacture of claim 11, wherein the first loudspeaker cabinet has a master rank, wherein the non-transitory machine readable medium further comprises instructions that when executed by the processor cause the first loudspeaker cabinet to reduce the master rank of the first loudspeaker cabinet, based on the temperature data indicating an increase in the temperature of the first loudspeaker cabinet.

14. The article of manufacture of claim 13, wherein the non-transitory machine readable medium includes further instructions that when executed by the processor cause the first loudspeaker cabinet to repeatedly receive a message from the second loudspeaker cabinet containing a master rank of the second loudspeaker cabinet, wherein the instructions to cease comprises instructions that when executed by the processor cause the first loudspeaker cabinet to determine that the second loudspeaker cabinet is to (i) obtain the audio signal from the audio source and (ii) wirelessly transmit the audio signal to the first loudspeaker cabinet for playback based on the master rank of the first loudspeaker cabinet being lower than the master rank of the second loudspeaker cabinet.

15. The article of manufacture of claim 14, wherein the instructions to cease comprise instructions that when executed by the processor cause the first loudspeaker cabinet to rotate the network master responsibility between the first and second loudspeaker cabinets, such that each cabinet retains the network master responsibility according to a predetermined schedule.

16. A first wireless audio system component comprising:

a loudspeaker cabinet;

a loudspeaker transducer integrated in the cabinet;

a processor integrated in the cabinet; and a non-transitory machine readable medium integrated in the cabinet, storing instructions which when executed by the processor render some of an input audio signal into a rendered audio signal for driving the loudspeaker transducer to playback the rendered audio signal, wherein the first wireless audio system component has a network master responsibility of obtaining the input audio signal from an audio source and wirelessly transmitting some of the input audio signal to a second wireless audio system component of a plurality of wireless audio system components, for playback by the second wireless audio system component;

receive, while the loudspeaker transducer is playing back the rendered audio signal, temperature data that is indicative of temperature of the first wireless audio system component and determine whether a thermal threshold of the first wireless audio system component has been reached, based on the temperature data; and in response to the thermal threshold being reached, give up the network master responsibility from the first wireless audio system component to the second wireless audio system component.

17. The first wireless audio system component of claim 16, wherein instructions to give up the network master responsibility to the second wireless audio system component comprises instructions that when executed by the processor cease to (i) obtain the input audio signal from the audio source and (ii) wirelessly transmit the input audio signal to the second wireless audio system component.

18. The first wireless audio system component of claim 17, wherein the non-transitory machine readable medium further comprises instructions that when executed by the processor receive, from the second wireless audio system component, some of the input audio signal for rendering into the rendered audio signal for driving the loudspeaker transducer, wherein the input audio signal is now obtained from the audio source by the second wireless audio system component and not by any others of the plurality of wireless audio system components.

19. The first wireless audio system component of claim 16, wherein the first wireless audio system component has a master rank, wherein the non-transitory machine readable medium further comprises instructions that when executed by the processor reduce the master rank of the first wireless audio system component, based on the temperature data indicating an increase in the temperature of the first wireless audio system component.

20. The first wireless audio system component of claim 19, wherein the non-transitory machine readable medium further comprises instructions that when executed by the processor repeatedly receive a message from the second wireless audio system component containing a master rank of the second wireless audio system component, wherein the instructions to give up the network master responsibility comprise instructions that when executed by the processor cause the first wireless audio system component to determine that the second wireless audio system component is to be given the network master responsibility based on the master rank of the first wireless audio system component being lower than the master rank of the second wireless audio system component.

21. The first wireless audio system component of claim 16, wherein the loudspeaker cabinet includes one of a standalone loudspeaker or a multi-function electronic device that has an integrated speaker.

* * * * *